(12) United States Patent
Matsubara et al.

(10) Patent No.: US 6,741,029 B2
(45) Date of Patent: May 25, 2004

(54) LIGHT EMISSION APPARATUS AND METHOD OF FABRICATING THE SAME

(75) Inventors: Hideki Matsubara, Osaka (JP); Toshihiko Takebe, Itami (JP); Hiroki Ishinaga, Kyoto (JP); Mamoru Maegawa, Kyoto (JP)

(73) Assignees: Sumitomo Electric Industries, Ltd., Osaka (JP); Rohm Co., Ltd., Kyoto (JP)

(*) Notice: Subject to any disclaimer, the term of this patent is extended or adjusted under 35 U.S.C. 154(b) by 0 days.

(21) Appl. No.: 10/112,323

(22) Filed: Mar. 28, 2002

(65) Prior Publication Data

US 2002/0190637 A1 Dec. 19, 2002

(30) Foreign Application Priority Data

Mar. 30, 2001 (JP) ............................... 2001-097860

(51) Int. Cl.[7] .............. H01L 33/00; H01J 1/62
(52) U.S. Cl. ............ 313/512; 313/498; 313/499; 313/503; 313/506; 313/311; 428/690; 428/217; 315/169.3
(58) Field of Search ................. 313/498, 499, 313/503, 506, 512; 428/690, 917, 212; 315/169.3

(56) References Cited

U.S. PATENT DOCUMENTS

| | | |
|---|---|---|
| 4,347,655 A | 9/1982 | Zory et al. |
| 5,221,984 A | 6/1993 | Furuyama et al. |
| 5,226,053 A | 7/1993 | Cho et al. |
| 5,660,461 A | 8/1997 | Ignatius et al. |
| 5,962,133 A | 10/1999 | Yamaguchi et al. |
| 6,204,094 B1 | 3/2001 | Hotchkiss et al. |
| 6,206,962 B1 | 3/2001 | Kijima et al. |
| 6,318,908 B1 * | 11/2001 | Nakanishi et al. ............ 385/89 |
| 2002/0153835 A1 * | 10/2002 | Fujiwara et al. ............ 313/512 |

FOREIGN PATENT DOCUMENTS

| | | |
|---|---|---|
| JP | 61 234525 | 10/1986 |
| JP | 03 161981 | 7/1991 |
| JP | 05 037020 | 2/1993 |
| JP | 05 152609 | 6/1993 |
| JP | 05 335267 | 12/1993 |
| JP | 06 005920 | 1/1994 |
| JP | 06 037356 | 2/1994 |
| JP | 06 061529 | 3/1994 |
| JP | 06 302863 | 10/1994 |
| JP | 09 027643 | 1/1997 |
| JP | 2000 082845 | 3/2000 |
| JP | 2000 101149 | 4/2000 |
| JP | 2000 150960 | 5/2000 |
| JP | 2001 028459 | 1/2001 |

OTHER PUBLICATIONS

"Low–threshold room–temperature CW operation of ZNSE– based blue/green laser diodes grown on conductive ZnSe substrates" by Nakanishi et al., Electronics Leters, vol. 34, Issue 5, 1998, pp. 496–497.

* cited by examiner

Primary Examiner—Nimeshkumar D. Patel
Assistant Examiner—Sharlene Leurig
(74) Attorney, Agent, or Firm—W. F. Fasse; W. G. Fasse

(57) ABSTRACT

A light emission apparatus includes: an electrode; a LED mounted on the electrode with an indium layer interposed therebetween, the LED having a substrate formed of an n-type ZnSe single crystal, and an epitaxial light emission structure formed of a compound crystal comprising ZnSe serving as a matrix, the epitaxial light emission structure being provided on the substrate and emitting light when an electric current is introduced thereinto; and resin encapsulating the LED, the resin having a glass transition temperature of lower than 80 degrees centigrade or being soft to be still elastic in a vicinity of the LED at room temperature.

6 Claims, 5 Drawing Sheets

E: LIGHT EMISSION FROM EPITAXIAL LIGHT EMISSION STRUCTURE
S: OPTICALLY EXCITED FLUORESCENCE EMISSION FROM SUBSTRATE

LIGHT EMISSION APPARATUS AND METHOD OF FABRICATING THE SAME

BACKGROUND OF THE INVENTION

1. Field of the Invention

The present invention relates generally to novel semiconductor light emitting devices provided in the form of a single semiconductor chip and capable of emitting light of white color, a neutral color between red and blue, such as magenta, pink and the like, and the like and particularly to structures for reducing stress exerted to the same.

2. Description of the Background Art

As a material for a high bright light emitting diode (LED) a device including a light emitting layer of AlGaAs, GaAsP and the like for red color has been put to practical use and an intensity of no less than several candela (Cd) has been implemented by an inexpensive LED. Other than LEDs for red, GaP for green and yellow-green, GaInN for blue and green, AlGaInP for Mars yellow and yellow have all been put to practical use as inexpensive LEDs.

These LEDs, however, all use a single semiconductor material for their light emitting layers and in principle they can only provide monochromatic light emission. Thus, while typical LED structures are capable of emitting light of a primary color, a color between red and green, and a color between green and blue, such as red, Mars yellow, yellow, yellow-green, green, blue-green, blue, blue-violet and violet, they are incapable of emitting light of a neutral color between red and blue and a neutral color between red, green and blue.

For illumination, decoration and some other similar applications for displaying, a source of light of a color between red and blue (e.g., magenta, pink), a color between red, blue and green (i.e., white), or the like is demanded, rather than a source of monochromatic light as described above. As has been described above, typical LEDs can only achieve a source of monochromatic light, and thus a fluorescent lamp, an incandescent lamp or the like is used as a source of light but it has suffered a short lifetime, a large size and a low luminosity.

In contrast, the present inventors have succeeded in obtaining white light, pink light, magenta light and the like from a single LED using a ZnSe-based homoepitaxial layer formed on a ZnSe substrate, as has been described in Japanese Patent Laying-Open Nos. 2000-82845 and 2000-150960.

A ZnSe substrate which is doped with iodine, aluminum, chlorine, bromine, gallium, indium or the like can provide conductance of n-type, and when it is illuminated with light of shorter than 510 nm ZnSe can provide a so-called self-activated (SA) luminescence, a broad light emission having a center of an emission wavelength in a range of 550 nm to 650 nm. This light emission appears to be yellow, Mars yellow, or the like.

The central wavelength and the half-width of emission spectrum of SA luminescence can be adjusted by the species, amount or the like of the dopant introduced. Furthermore, a light emission structure of ZnSe used as a matrix can be formed on a ZnSe substrate through homoepitaxy. In this light emission structure, ZnSe or ZnCdSe or ZnSeTe can be used for an active layer to form a high bright LED emitting light at a wavelength from 460 nm to 510 nm for blue color or blue-green color.

FIG. 1 shows a concept of the present LED 5. In the figure an epitaxial light emission structure provides blue or blue-green light emission, of which that emitted toward the substrate is absorbed by a ZnSe substrate 1 and excites optically SA light emission and thus provides yellow, Mars yellow or red light. The former light emission and the latter light emission can be combined together to obtain emission of light of white, pink, magenta or other similar neutral colors.

The present LED 5 employs a group II–VI compound semiconductor, or ZnSe, as a main material. It should be noted, however, that this ZnSe crystallographically has a significantly smaller strength than GaP, GaAs and other similar group III–V compound semiconductor that are used for popular LEDs.

As such, if in a mounting process at each step an LED chip has stress introduced therein, the ZnSe substrate crystal, epitaxial light emission structure 2 and the like are partially damaged, cracked or the like and the device is thus disadvantageously significantly impaired.

Fig. 2 shows an example of a light emission apparatus having the LED 5 described above. As shown in FIG. 2, LED 5 is mounted on a resin base 3 having a patterned interconnection (or electrode) 4, with an indium layer B attached between the LED 5 and the patterned interconnection 4. LED 5 is connected to patterned interconnection 4 by a gold wire 7 and encapsulated with transparent resin 6.

The fabrication of the above inexpensive LED 5 essentially requires transparent resin 6. However, in the step of encapsulating the chip with transparent resin 6 the resin cures and contracts and thus introduces stress which significantly contributes to degradation of the device.

Furthermore, the present LED 5, as described in Japanese Patent Laying-Open No. 2001-28459, uses indium layer 8 serving as a soldering material also as a material for an ohmic electrode.

If the melting point of indium layer 8 and the softening point of transparent resin 6 are close, then, after a completed LED lamp for example reflowed or soldered to be mounted, indium layer (electrode) 8 would be affected and the value in driving voltage of the LED lamp would vary disadvantageously.

These issues are common to ZnSe-based LEDs for white color and pink, magenta and other similar neutral colors.

SUMMARY OF THE INVENTION

The present invention has been made to overcome the above issues. An object of the present invention lies, in a light emission apparatus mounted with a ZnSe-based LED chip fixed on an electrode by means of an indium layer, in reducing degradation of a device that is attributed to stress introduced when resin encapsulating the LED chip cures and contracts, and also in preventing the indium layer from being degraded and thus changing a value of a driving voltage of the LED lamp.

In accordance with the present invention a light emission apparatus in one aspect includes: an electrode; a light emitting device mounted on the electrode with an indium layer interposed therebetween, the light emitting device having a substrate formed of an n-type ZnSe single crystal, and an epitaxial light emission structure formed of a compound crystal comprising ZnSe serving as a matrix thereof, the epitaxial light emission structure being provided on the substrate and emitting light when an electric current is introduced thereinto; and resin encapsulating the light emitting device, the resin having a glass transition temperature of lower than 80 degrees centigrade.

The resin includes epoxy resin having a glass transition temperature of higher than 30 degrees centigrade and lower than 80 degrees centigrade and being transparent or having a light diffusing agent mixed therein.

In accordance with the present invention a light emission apparatus in another aspect includes: an electrode; a light emitting device mounted on the electrode with an indium layer interposed therebetween, the light emitting device having a substrate formed of an n-type ZnSe single crystal, and an epitaxial light emission structure formed of a compound crystal comprising ZnSe serving as a matrix thereof, the epitaxial light emission structure being provided on the substrate and emitting light when an electric current is introduced thereinto; and resin encapsulating the light emitting device. The resin includes a first resin that is transparent or that has a light diffusing agent mixed therein, and that covers the light emitting device, and a second resin that is transparent or that has a light diffusing agent mixed therein, and that covers the first resin, the first resin having an elasticity corresponding to an elongation of no less than 40% at room temperature, the second resin being harder than the first resin.

The first resin includes a silicone resin and the second resin includes an epoxy resin. Furthermore the present apparatus may be a so-called surface-mounted type including a base formed of an insulator, wherein the electrode includes a patterned electrode formed on the base.

The present apparatus may include a reflector provided on the base to surround the light emitting device for reflecting fluorescence received from the substrate, wherein the resin is introduced into a region surrounded by the reflector.

In accordance with the present invention a method of fabricating a light emission apparatus, in one aspect, includes the steps of: mounting a light emitting device on an electrode with an indium layer interposed therebetween, the light emitting device having a substrate formed of an n-type ZnSe single crystal, and an epitaxial light emission structure formed of a compound crystal comprising ZnSe serving as a matrix thereof, the epitaxial light emission structure being provided on the substrate and emitting light when an electric current is introduced thereinto; and dropping epoxy resin on the light emitting device and then curing the epoxy resin to encapsulate the light emitting device, the epoxy resin having a glass transition temperature of no more than 80 degrees centigrade.

In accordance with the present invention a method of fabricating a light emission apparatus, in another aspect, includes the steps of: mounting a light emitting device on an electrode with an indium layer interposed therebetween, the light emitting device having a substrate formed of an n-type ZnSe single crystal, and an epitaxial light emission structure formed of a compound crystal comprising ZnSe serving as a matrix thereof, the epitaxial light emission structure being provided on the substrate and emitting light when an electric current is introduced thereinto; covering the light emitting device with silicone resin; and transfer-molding epoxy resin to cover the silicone resin therewith.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
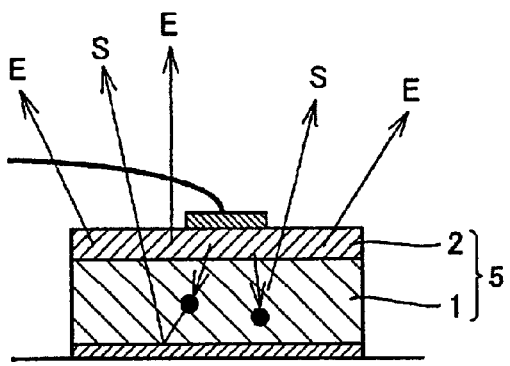
FIG. 1 is a cross section of a multi-color LED allowing a substrate to emit light.
Figure 2:
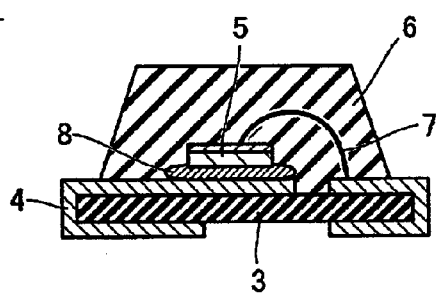
FIG. 2 is a cross section of a light emission apparatus having a multi-color LED allowing a substrate to emit light.

The present invention is applied to a bare chip of a multi-color LED allowing a ZnSe-based substrate to emit light, as shown in FIG. 2, placed on a resin base 3 having a patterned interconnection (an electrode) 4, with an indium layer 8 posed therebetween, and furthermore encapsulated with transparent resin 6.

Generally in packaging a LED it is encapsulated with resin by casting, injection (or transfer-molding), potting or other similar various techniques, although the transparent resin used is overwhelmingly epoxy resin, since epoxy resin is highly transparent, significantly strong, easy to handle, highly weather-resistant, and inexpensive.

Figure 3:
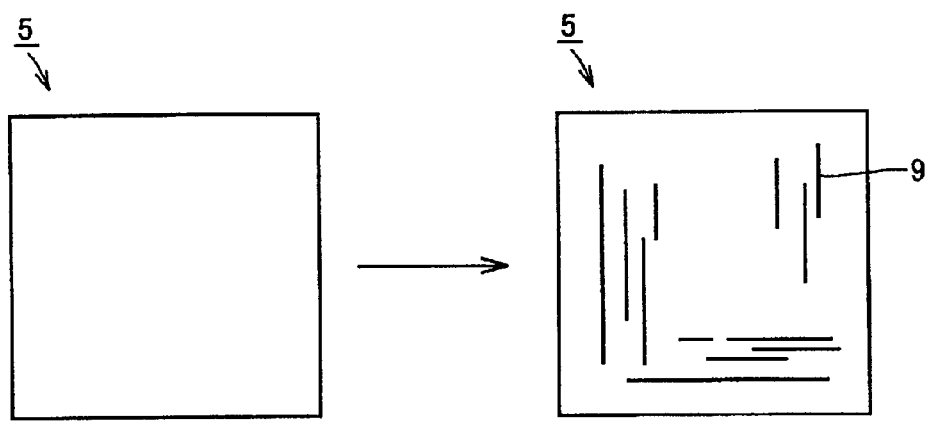
FIG. 3 shows an LED chip having cracks attributed to stress introduced when resin encapsulating it contracts.

However, if ZnSe-based LED (chip) 5, to which the present invention is applied, is encapsulated with a typical, thermosetting epoxy resin, such as resin having as high a glass transition temperature (Tg) as 120 degrees centigrade or more, then when the resin thermosetts and thus contracts it would introduce stress which is in turn exerted to the chip directly and, as shown in FIG. 3, in LED 5 the epitaxial light emission structure would crack 9. This contributes to rapidly reduced lifetime of the device.

This is a disadvantage unique to a crystallographically weak ZnSe-based LED 5 that would not be encountered by a typical LED using GaP or the like. Accordingly a first issue of the present invention to be addressed is to decrease stress of resin 6 to maintain in a lamp (a light emitting apparatus) a lifetime that a bare chip of ZnSe-based LED 5 inherently has.

Furthermore, in the LED 5, as has been described previously, indium serving as a soldering material is also used as a material for an ohmic electrode to reduce cost. In a typical process for mounting an LED this soldering material is a thermosetting, epoxy-based silver paste. As such, for the present LED, a totally different process is adopted.

Since the soldering indium has a significantly low melting point of approximately 155 degrees centigrade, it softens at a temperature close to Tg of no less than 120 degrees centigrade of the aforementioned, typical transparent resin.

In general to mount an LED lamp the lamp is required to undergo a reflowing process, a soldering process or other similar high-temperature processes. For the present LED at such a high temperature (e.g., 230 degrees centigrade), however, transparent encapsulating resin 6 would soften and the soldering indium would also start to melt.

Thus when it is exposed to the high temperature and furthermore in cooling it from the high temperature when the transparent resin and the soldering indium are solidifying, the LED chip therein can disadvantageously move, which does not occur when the soldering material is typical silver paste.

Figure 4:
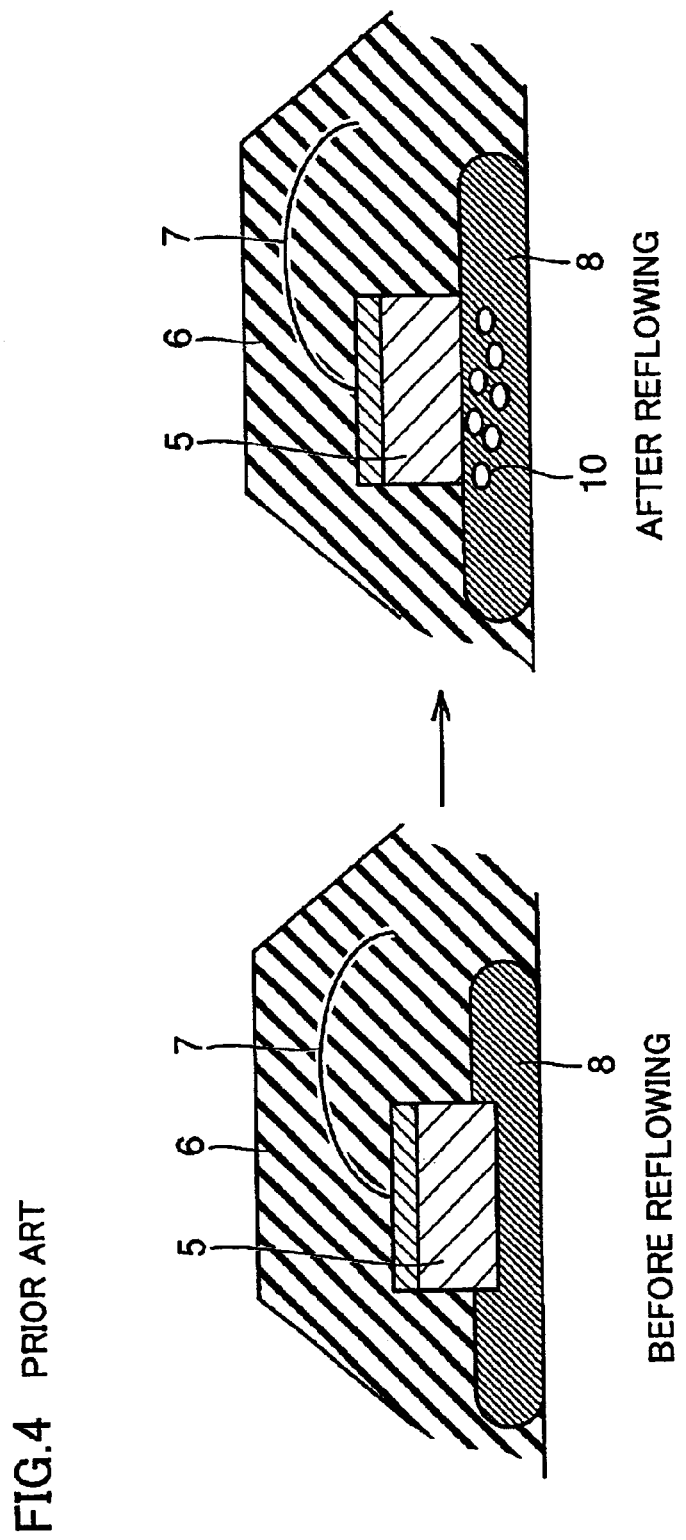
FIG. 4 shows an indium layer internally having voids after reflowing.

In particular, in cooling if the indium is still soft while the resin starts to solidify then stress is exerted to move the LED chip upwards and as a result the LED chip tends to float up from the indium electrode. Thus, as shown in FIG. 4, indium layer 8 internally has a void 10 or the like and a large series resistance component would be introduced. This has also disadvantageously increased a value in driving voltage of the LED lamp. A second issue to be addressed by the present invention is resolve this problem unique to indium solder.

In accordance with the present invention the present LED 5 is encapsulated with transparent resin 6 either having a glass transition temperature, corresponding to the softening point of the resin, which is sufficiently low, more specifically 80 degrees centigrade or less (preferably 30 to 80 degrees centigrade) or being soft to have elasticity even at room temperature (for example having an elongation exceeding 40%) to address the above two issues simultaneously.

Note that to allow resin 6 for example of epoxy resin to have a glass transition temperature of 80 degrees centigrade or less, a curing agent adjusted in ratio can be used to reduce crosslink density in the resin at curing or allows the resin to have a principal chain structure to be significantly macromolecular.

For the first issue of the decrease of stress affected to LED 5, the reduction of curing and contraction of resin 6 is effective. A well known technique to achieve this is use as resin 6 a thermoplastic resin having a low glass transition temperature in particular. For example, the present inventors, as disclosed in Japanese Patent Laying-Open No. 2000-101149, use low-Tg epoxy resin as means reducing stress influenced to a package of LED 5.

This technique, however, is intended to decrease stress between the package and resin 6. Furthermore, in general techniques, low-Tg resin is often used in order to prevent disconnection of wire or the like.

In the present invention this technique is applied in order to decrease a significantly small stress introduced between LED 5 and transparent resin 6 that has a level negligible for typical LED devices and it has been found that using transparent thermoplastic resin having a glass transition temperature of 80 degrees centigrade or less, epoxy resin in particular, can prevent the light emission apparatus from having an extremely reduced lifetime.

It has been found that a similar effect can be obtained by using soft resin which is elastic after it has cured, such as silicone resin (for example having an elongation of 200%) or epoxy acrylate resin (for example having an elongation of 50%), as resin 6 to prevent the light emission apparatus from having reduced lifetime.

In general, these soft resins have high moisture permeability and can thus result in device failure. Accordingly as a protection layer a hard transparent resin is further used to seal around the soft resin and this also has been found to allow a lamp structure free from reduction in life.

It has also been found from an experiment that the second issue of preventing series resistance in indium layer 8 that is introduced during a reflowing or other similar high-temperature processes can be prevented by changing a property of transparent resin 6.

As has been described previously, it had been known that the introduction of the series resistance is attributed to the fact that in a reflowing or other similar processes when temperature is reduced a chip receives a force floating it up. The force allowing the chip to float up is attributed to the fact that in exposure to high temperature the indium melts or is softened, while the resin starts to solidify.

It was considered that this can be prevented by encapsulating LED 5 with a resin which does not cure before indium sufficiently solidifies, i.e., a resin having a low glass transition temperature or a soft resin which still has elasticity at room temperature.

Accordingly an experiment was conducted and epoxy resin, silicone resin and the like having a Tg of 80 degrees centigrade or less and elastic epoxy acrylate resin were used to encapsulate LED 5, and it was found that indium layer 8 can be prevented from having increased resistance.

These encapsulating techniques are identical to that which has resolved the first issue and the above two issues can thus be addressed simultaneously.

While in the above experiment the LED is encapsulated with resin mainly by means of potting to observe whether stress to the package is reduced, it may alternatively be encapsulated for example by means of casting to obtain a similar effect.

Transfer-molding is not suitable for directly encapsulating the present ZnSe-based LED 5, since the Tg, type and the like of the resin used can hardly be changed. However, there is not a problem in using transfer-molding to seal LED 5 encapsulated with silicone or any other similar soft resin (junction coat resin) previously.

Thus the present technique allows use of an inexpensive process using transparent resin to encapsulate ordinary LED 5. Furthermore, resin 6 is not required to be transparent and it may have a light scattering medium mixed therein. Furthermore, the present technique does not impose any limitation on the geometry of the package.

Thus, with the above-described technique, an inexpensive technique using resin for encapsulating that is similar to a conventional technique can be used to fabricate a source of light of white color, and magenta, pink and any other similar neutral colors which are sufficiently reliable and have a variety of color tones.

Hereinafter reference will be made to FIGS. 5–10 to describe the present invention in embodiments.

First Embodiment

Figure 5:
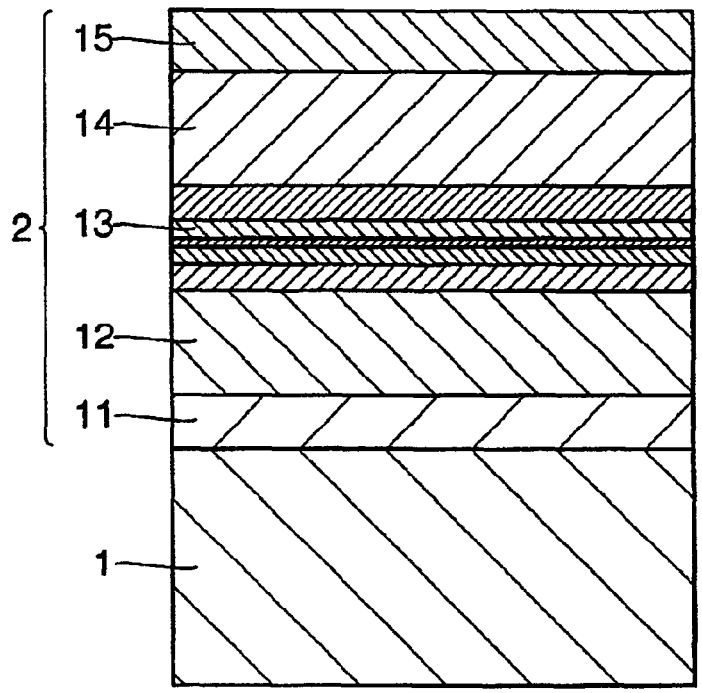
FIG. 5 is a cross section of an ZnSe substrate and an epitaxial light emission structure of an LED of the present invention in a first embodiment.
Figure 6:
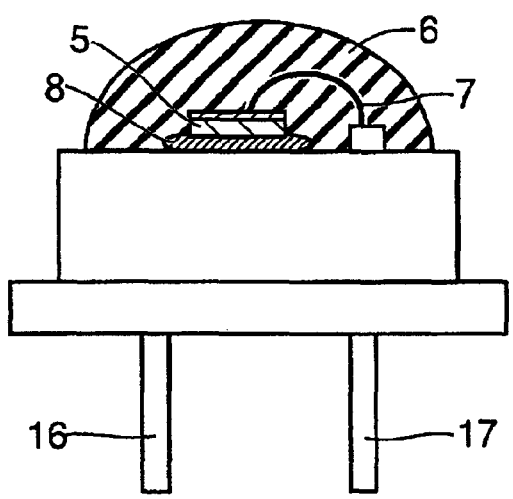
FIG. 6 is a side view of the light emission apparatus of the first embodiment.

As shown in FIG. 5, on an iodine-doped, n-type ZnSe substrate 1 an epitaxial light emission structure 2 for blue color having a peaked emission wavelength of 485 nm is grown by homoepitaxy with an MBE method.

Epitaxial light emission structure 2 is composed of a p-type contact layer 15 having a superlattice structure of a stack of layers of ZnTe and ZnSe doped to be p-type, a p-type clad layer 14 formed of a layer of $Zn_{0.85}Mg_{0.15}S_{0.10}Se_{0.90}$ doped to be p-type, a single quantum well active layer 13 formed of a structure of a stack of a ZnSe layer and a $Zn_{0.88}Cd_{0.12}Se$ layer, an n-type clad layer 12 formed of a $Zn_{0.85}Mg_{0.15}S_{0.10}Se_{0.90}$ layer doped to be n type, and an n-type ZnSe buffer layer 11.

On p-type contact layer 15 of the present epitaxial wafer, there is formed a patterned, p-type electrode formed of Ti/Au in a lattice, and there is further formed a full-surface covered Au electrode in a thin film of no more than 20 nm in thickness, and on ZnSe substrate 1 at a back surface thereof an n-type electrode formed of In is provided. After the electrode is formed, the epitaxial wafer is cut to be a chip (of type 1) sized to be 400 $\mu$m×400 $\mu$m and having a thickness of 200 $\mu$m. This chip is an LED chip of a type allowing white light to be emitted.

Furthermore, exactly the same procedure is used to form epitaxial light emission structure 2 on an Al-doped ZnSe substrate 1 for blue color having a peaked emission wavelength of 475 nm and cut the resultant product in the form of a chip (type 2). This chip is an LED chip of a type allowing pink light and magenta light to be emitted.

These chips were mounted on a stem of To-18 type having electrodes 16 and 17 and they were potted and thus encapsulated with resin in seven different manners.

Figure 7:
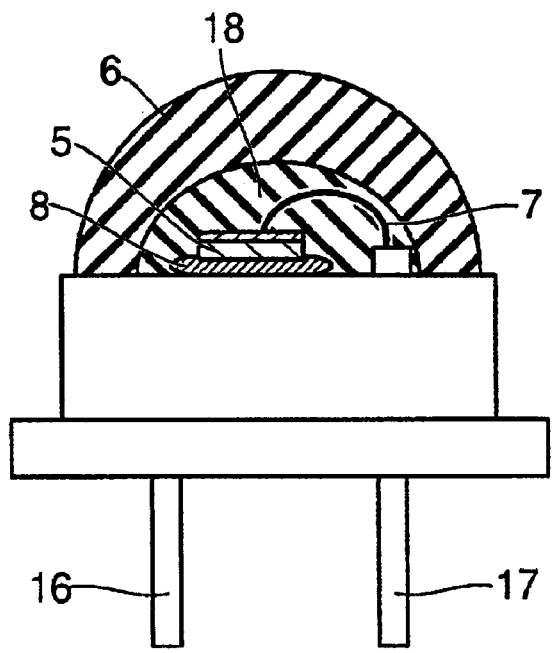
FIG. 7 is a side view of the light emission apparatus of the first embodiment in a variation.

Devices A (type 1) and A' (type 2) were encapsulated with a typical transparent epoxy resin having Tg=120 degrees centigrade, devices B (type 1) and B' (type 2) were encapsulated with transparent epoxy resin having Tg=80 degrees centigrade, devices C (type 1) and C' (type 2) were encapsulated with transparent epoxy resin having Tg=60 degrees centigrade, devices D (type 1) and D' (type 2) were encapsulated with transparent epoxy resin having Tg=40 degrees centigrade, devices E (type 1) and E' (type 2) were encapsulated with silicone resin (gelled) having an elongation of 250%, devices F (type 1) and F' (type 2) were encapsulated with epoxy acrylate resin having an elongation of 50%, and devices G (type 1) and G' (type 2) are as shown in FIG. 7, having LED 5 immediately surrounded by and thus encapsulated with elastic silicone resin (junction coat resin) 18 and further encapsulated therearound with typical transparent resin (epoxy resin) 6 having Tg=120 degrees centigrade. Furthermore for reference were also prepared devices H (type 1) and H' (type 2), which were products mounted without resin encapsulating them.

All of the devices encapsulated with resin initially had their operating voltages (Vf) measured. Thereafter, they were annealed at 250 degrees centigrade for ten seconds and thus thermally treated to correspond to a reflowing process and their operating voltages were furthermore examined to see how they vary. Subsequently, a reliability test was conducted. More specifically, the devices were operated at 60 degrees centigrade (to accelerate degradation) to observe how the differences in packaging affect the lifetimes of the devices.

Each device had an initial operating voltage when it was operated with a currant of 5 mA, a final operating voltage when it was operated with a current of 5 mA after the annealing process, and a half-life in luminance during the operation of the device at 60 degrees centigrade with 5 mA, as shown in Table 1.

TABLE 1

| Names of Samples | A | B | C | D | E | F | G | H |
|---|---|---|---|---|---|---|---|---|
| Initial Vf for 5 mA (V) | 2.45 | 2.44 | 2.46 | 2.45 | 2.43 | 2.47 | 2.45 | 2.45 |
| Vf after annealing for 5 mA (V) | 2.62 | 2.49 | 2.45 | 2.46 | 2.45 | 2.45 | 2.46 | 2.45 |
| Half-life in luminance (h) | 0.4 | 690 | 900 | 970 | 1,250 | 1,100 | 920 | 1,000 |

| Names of Samples | A' | B' | C' | D' | E' | F' | G' | H' |
|---|---|---|---|---|---|---|---|---|
| Initial Vf for 5 mA (V) | 2.47 | 2.48 | 2.45 | 2.43 | 2.48 | 2.45 | 2.49 | 2.45 |
| Vf after annealing for 5 mA (V) | 2.72 | 2.47 | 2.43 | 2.46 | 2.43 | 2.42 | 2.46 | 2.45 |
| Half-life in luminance (h) | 0.4 | 210 | 390 | 410 | 330 | 270 | 320 | 300 |

Each device had an initial operating voltage when it was operated with a currant of 5 mA, a final operating voltage when it was operated with a current of 5 mA after the annealing process, and a half-life in luminance during the operation of the device at 60 degrees centigrade with 5 mA, as shown in Table 1.

Generally, it can be said throughout the experiment that there is not a difference at all between a chip for white color and that for pink, magenta or other similar color and that a ZnSe-based, multi-color light emitting chip that is encapsulated with epoxy resin having Tg of lower than 80 degrees centigrade can characteristically prevent Vf from disadvantageously increasing during a reflowing process and a lifetime in luminance from disadvantageously decreasing as the chip is encapsulated.

Furthermore in a similar experiment a device was encapsulated with transparent resin 6 having fine particles of 20% by weight of silica mixed therein as a light diffusing agent and exactly the same result was obtained.

Second Embodiment

Figure 8:
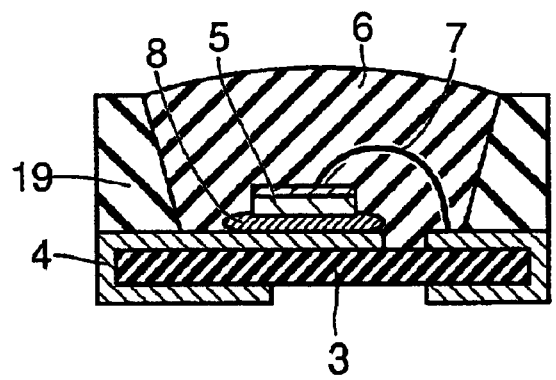
FIG. 8 is a cross section of the light emission apparatus of the present invention in a second embodiment.

There was prepared a chip similar to that of type 1 used in the first embodiment. The chip was mounted in a package having a reflector 19 that has a geometry as shown in FIG. 8 and the chip was potted and thus encapsulated with resin in five different manners.

Figure 9:
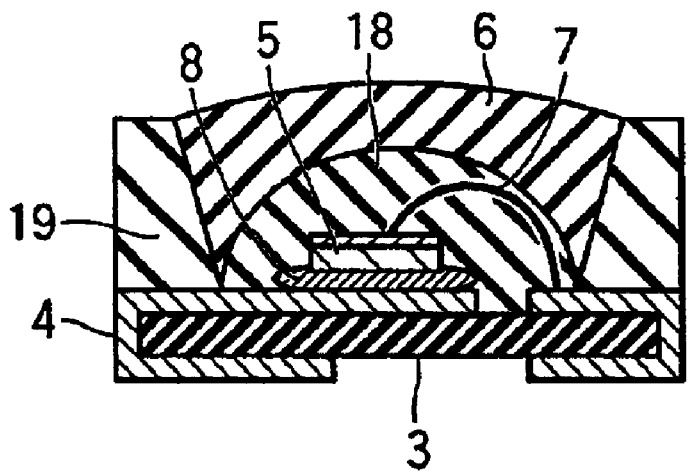
FIG. 9 is a cross section of the light emission apparatus of the second embodiment in a variation.

A device I was encapsulated with a typical transparent epoxy resin having Tg=120 degrees centigrade, a device J was encapsulated with transparent epoxy resin having Tg=80 degrees centigrade, a device K was encapsulated with transparent epoxy resin having Tg=60 degrees centigrade, a device L was encapsulated with transparent epoxy resin having Tg=40 degrees centigrade, and a device M was as shown in FIG. 9, having LED 5 previously surrounded by and thus encapsulated with elastic silicone resin (junction coat resin) 18 of 150% in elongation and further encapsulated therearound with typical transparent resin (epoxy resin) 6 having Tg=120 degrees centigrade. Furthermore for reference was also prepared a device N, which is a product mounted without resin encapsulating it.

All of the devices encapsulated with resin initially had their respective Vfs measured and they then underwent a typical reflowing process (with a maximum temperature of 250 degrees centigrade for ten seconds) four times and then examined for any change in Vf. Subsequently, a reliability test was conducted. More specifically, they were operated at 60 degrees centigrade to accelerate degradation to see how the differences in packaging affect the lifetimes of the devices.

Each device had an initial operating voltage when it was operated with a current of 5 mA, a final operating voltage when it was operated with a current of 5 mA after the reflowing process, and a half-life in luminance during the operation of the device at 60 degrees centigrade with 5 mA, as shown in Table 2.

TABLE 2

| Names of Samples | I | J | K | L | M | N |
|---|---|---|---|---|---|---|
| Initial Vf for 5 mA(V) | 2.45 | 2.45 | 2.43 | 2.45 | 2.47 | 2.47 |
| Vf after reflowing for 5 mA (V) | 2.66 | 2.46 | 2.44 | 2.46 | 2.45 | 2.47 |
| Half-life in luminance (h) | 2 | 690 | 1,050 | 920 | 840 | 800 |

It can be understood from Table 2 that by ref lowing at 250 degrees centigrade, only device I was significantly increased in Vf, whereas the other devices hardly varied in Vf. That is, also in a package of a reflector type, as well as in the first embodiment, using epoxy resin having a Tg of lower than 80 degrees centigrade or resin still soft at room temperature to encapsulate and seal LED 5 can prevent LED 5 from floating up due to a high-temperature ref lowing process and can prevent Vf from increasing disadvantageously.

Furthermore, as compared to device N in the form of a bare chip, only device I was extremely reduced in lifetime, as can be seen from Table 2, while the other devices hardly had a problem. The lifetime of device J, although somewhat reduced, is tolerable.

From this result it has been found that using epoxy resin having Tg of lower than 80 degrees centigrade or resin still soft at room temperature to seal LED 5 can also eliminate disadvantageously reduced lifetime in luminance.

Third Embodiment

There was prepared a chip similar to that of type 1 used in the first embodiment. The chip was mounted on a flat package shaped as shown in FIG. 2 and it was transfer-molded and casted and thus encapsulated with resin in four different manners.

Figure 10:
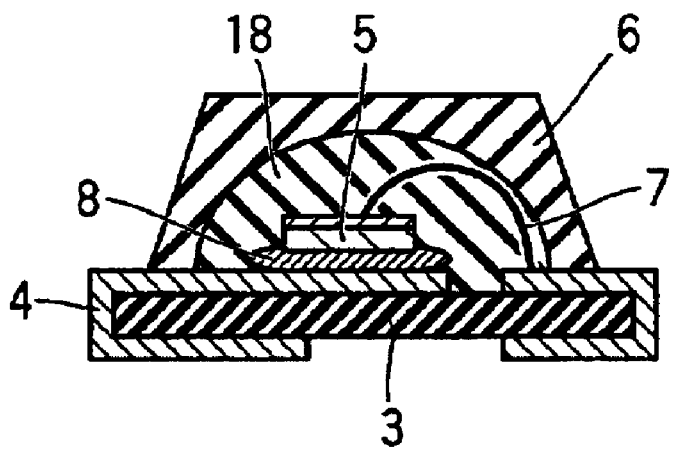
FIG. 10 is a cross section of the light emission apparatus of the present invention in a third embodiment.

A device O was transfer-molded and thus encapsulated with resin with a typical transparent epoxy resin having Tg=130 degrees centigrade. A device P was encapsulated as shown in FIG. 10, having LED 5 previously encapsulated with elastic silicone resin (junction coat resin) 18 of 120% in elongation and furthermore transfer-molded and thus encapsulated therearound with typical transparent resin (epoxy resin) 6 having Tg=130 degrees centigrade. A device Q was cast and thus encapsulated with typical transparent epoxy resin having Tg=120 degrees centigrade. A device R was cast and thus encapsulated with transparent epoxy resin having Tg=50 degrees centigrade. Furthermore for reference there was also prepared a device S mounted without resin encapsulating.

They were transfer-molded using a resin molding die having a temperature of approximately 140 degrees centigrade, which is sufficiently lower than the melting point of indium. Furthermore in casting them a plastic case was used for molding resin and a rubber-based material was inserted at an interface of the case and the substrate to prevent the resin from leaking when it cures.

All of the devices encapsulated with resin initially had their respective Vfs measured and they then underwent a typical reflowing process (with a maximum temperature of 250 degrees centigrade for ten seconds) four times and then examined for any change in Vf. Subsequently, a reliability test was conducted. More specifically, they were operated at 60 degrees centigrade to accelerate degradation to see how the differences in packaging affect the lifetimes of the devices.

Each device had an initial operating voltage when it was operated with a current of 5 mA, a final operating voltage when it was operated with a current of 5 mA after the ref lowing process, and a half-life in luminance during the operation of the device at 60 degrees centigrade with 5 mA, as shown in Table 3.

TABLE 3

| Names of Samples | O | P | Q | R | S |
|---|---|---|---|---|---|
| Initial Vf for 5 mA(V) | 2.43 | 2.45 | 2.43 | 2.44 | 2.48 |
| Vf after reflowing for 5 mA (V) | 2.74 | 2.44 | 2.64 | 2.46 | 2.46 |
| Half-life in luminance (h) | 310 | 710 | 8 | 790 | 800 |

It can be understood from Table 3 that by ref loving at 250 degrees centigrade, only devices O and Q were significantly increased in Vf, whereas the other devices hardly varied in Vf. That is, also in the flat package, as well as in the first embodiment, using epoxy resin having a Tg of lower than 80 degrees centigrade or resin still soft at room temperature to seal LED 5 can prevent LED 5 from floating up due to a high-temperature reflowing process and can prevent Vf from increasing disadvantageously.

Furthermore, as compared to device S in the form of a bare chip, device Q had an extremely reduced lifetime and device O had a lifetime reduced to no more than half, as can be read from the result. The other devices did not have a problem.

From this result it has also been found that using epoxy resin having Tg of lower than 80 degrees centigrade or resin still soft at room temperature to seal a vicinity of LED 5 can eliminate disadvantageously reduced lifetime in luminance.

As has been described above, in accordance with the present invention a resin having a glass transition temperature of lower than 80 degrees centigrade or soft resin still having elasticity after it has cured can be used to cover a light emitting device to prevent the device from degrading due to stress introduced when the resin encapsulating the device cures and contracts and also to prevent an indium layer from degrading and thus changing a value of driving voltage of the light emission apparatus. Furthermore, the device can be encapsulated with the resin, as described above, by a simple and inexpensive process.

Thus, a light emission apparatus emitting light of white color and magenta, pink and other similar neutral colors highly reliably in a variety of color tones, can be fabricated at low cost and can be expected to be significantly demanded in such applications as displaying in mobile gear, liquid crystal display's backlights, decoration and the like in particular.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emission apparatus comprising:

an electrode;

a light emitting device mounted on said electrode with an indium layer interposed therebetween, said light emitting device having a substrate formed of an n-type ZnSe single crystal, and an epitaxial light emission structure formed of a compound crystal comprising ZnSe serving as a matrix thereof, said epitaxial light emission structure being provided on said substrate and emitting light when an electric current is introduced thereinto; and resin encapsulating said light emitting device, said resin including a first resin that is transparent or that has a light diffusing agent mixed therein, and that covers said light emitting device, and a second resin that is transparent or that has a light diffusing agent mixed therein, and that covers said first resin, said first resin having an elasticity corresponding to an elongation of no less than 40% at room temperature, said second resin being greater in hardness than said first resin.

2. The apparatus of claim 1, wherein said first resin includes a silicone resin and said second resin includes an epoxy resin.

3. The apparatus of claim 1, further comprising a base formed of an insulator, wherein said electrode includes a patterned electrode formed on said base.

4. The apparatus of claim 3, further comprising a reflector provided on said base to surround said light emitting device for reflecting fluorescence received from said substrate, wherein said resin is introduced into a region surrounded by said reflector.

5. A method of fabricating the light emission apparatus of claim 1, comprising the steps of:

mounting the light emitting device the electrode with the indium layer interposed therebetween;

covering said light emitting device with said first resin being a silicone resin; and transfer-molding said second resin being an epoxy resin to cover said silicone resin therewith.

6. The apparatus of claim 1, wherein said first resin consists of a silicone resin and said second resin consists of an epoxy resin.

* * * * *

UNITED STATES PATENT AND TRADEMARK OFFICE
CERTIFICATE OF CORRECTION

PATENT NO. : 6,741,029 B2  Page 1 of 1
APPLICATION NO. : 10/112323
DATED : May 25, 2004
INVENTOR(S) : Matsubara et al.

It is certified that error appears in the above-identified patent and that said Letters Patent is hereby corrected as shown below:

Column 2:
line 20, afer "layer", replace "B" by --8--.

Column 7:
line 26, before "of", replace "currant" by --current--.

Column 8:
line 46, after "by", replace "ref lowing" by --reflowing--;
line 53, after "high-temperature", replace "ref lowing" by --reflowing--.

Column 9:
line 34, after "the", replace "ref" by --reflowing--;
line 35, before "process,", delete "lowing".
line 48, after "by", replace "ref loving" by --reflowing--.

Column 10:
line 57, after "device", insert --on--.

Signed and Sealed this

First Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 6,741,029 B2  
APPLICATION NO. : 10/112323  
DATED : May 25, 2004  
INVENTOR(S) : Matsubara et al.

It is certified that error appears in the above-identified patent and that said Letters Patent is hereby corrected as shown below:

Column 7:

delete the paragraph at lines 51 to 56 because this paragraph is a duplicate of column 7 lines 24 to 29.

after Table 1, at line 51, insert the following two paragraphs:

It can be understood from Table 1 that after being annealed at 250 degrees centigrade, only devices A and A' were significantly increased in Vf, whereas the other devices hardly varied in Vf. That is, it has been found that using epoxy resin having Tg of lower than 80 degrees centigrade or resin still soft at room temperature to encapsulate LED 5 can prevent LED 5 from floating up due to annealing and can thus prevent Vf from increasing disadvantageously.

Furthermore, as compared to devices H and H' in the form of a bare chip, only devices A and A' were extremely reduced in lifetime, as can be seen from Table 1, while the other devices hardly had a problem. The lifetimes of devices B and B', although somewhat reduced, are believed to be tolerable. From this result it has been found that using epoxy resin having Tg of lower than 80 degrees centigrade or resin still soft at room temperature to encapsulate LED 5 can also eliminate disadvantageously reduced lifetime in luminance.

Signed and Sealed this

Eleventh Day of September, 2007

JON W. DUDAS  
*Director of the United States Patent and Trademark Office*